United States Patent [19]
Bacchi et al.

[11] Patent Number: 5,382,806
[45] Date of Patent: Jan. 17, 1995

[54] SPECIMEN CARRIER PLATFORM AND SCANNING ASSEMBLY

[75] Inventors: Paul E. Bacchi, Novato; Manuel J. Robalino, San Francisco; Paul S. Filipski, Greenbrae, all of Calif.

[73] Assignee: Kensington Laboratories, Inc., Richmond, Calif.

[21] Appl. No.: 972,183

[22] Filed: Nov. 4, 1992

Related U.S. Application Data

[63] Continuation-in-part of Ser. No. 697,319, May 7, 1991, abandoned.

[51] Int. Cl.⁶ .............................................. G01V 9/04
[52] U.S. Cl. .................................... 250/561; 356/375; 414/223; 414/938; 414/940
[58] Field of Search ................ 356/375, 399, 400; 250/561; 414/331, 935, 936, 937, 938, 939, 940, 941, 222, 223

[56] References Cited

U.S. PATENT DOCUMENTS

| | | | |
|---|---|---|---|
| 4,597,708 | 7/1986 | Wheeler et al. | 414/331 |
| 4,643,629 | 2/1987 | Takahashi et al. | 414/331 |
| 4,776,744 | 10/1988 | Stonestreet et al. | 414/217 |
| 4,786,816 | 11/1988 | Ohmori et al. | 250/561 |
| 4,803,373 | 2/1989 | Imamura et al. | 414/331 |
| 4,895,486 | 1/1990 | Baker et al. | 414/939 |
| 5,003,188 | 3/1991 | Igari | 414/937 |

FOREIGN PATENT DOCUMENTS 63-72137  4/1988  Japan .................................. 414/937

*Primary Examiner*—F. L. Evans
*Attorney, Agent, or Firm*—Stoel Rives Boley Jones & Grey

[57] ABSTRACT

Specimen carrier carousels adapted to support a plurality of specimen carriers in a radial configuration and selectively position specimen carriers at associated processing stations are disclosed. Specimen carriers mounted on the carousel are automatically tilted during rotation of the carousel to properly seat the specimens in their respective carriers and to prevent specimen movement during rotation. Specimen carrier platforms are also disclosed. A scanning assembly is provided in association with a carrier platform or at least one carrier station of a carrier carousel to monitor and verify the orientation of specimens within a carrier prior to commencement of processing operations. A subtilt assembly may be provided to correct the orientation of specimens identified as mispositioned during the scanning operation and to facilitate detection of the presence and location of specimens in a carrier. The specimen carrier carousel is especially suitable for use in connection with the storage, transfer and processing is semiconductor wafer.

33 Claims, 10 Drawing Sheets

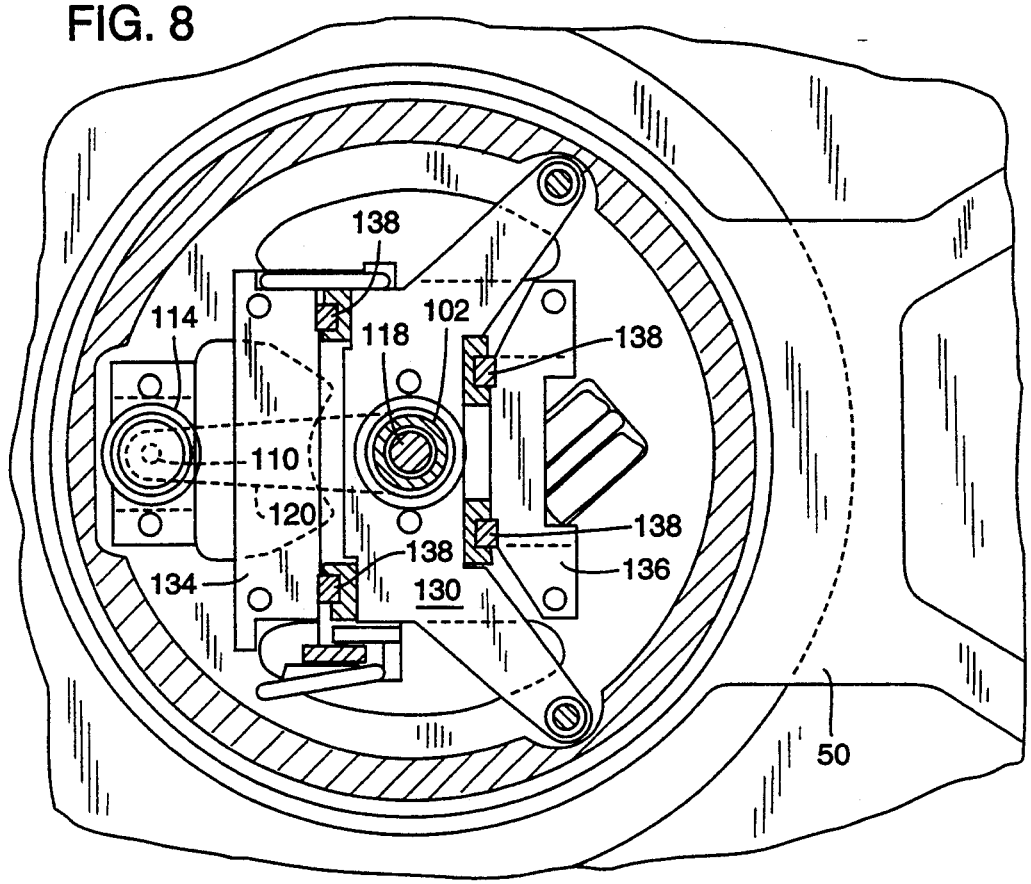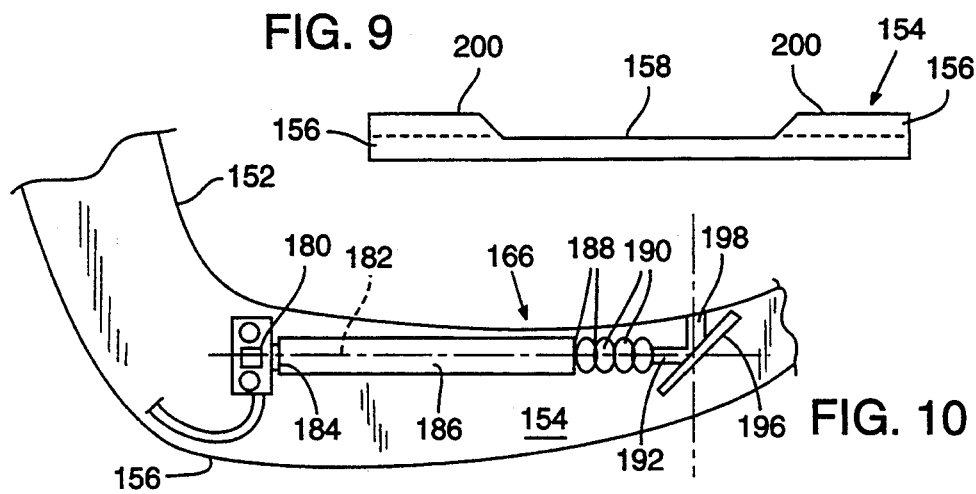

SPECIMEN CARRIER PLATFORM AND SCANNING ASSEMBLY

This is a continuation-in-part application of U.S. patent application Ser. No. 07/697,319, filed May 7, 1991, now abandoned.

TECHNICAL FIELD

The present invention relates to specimen processing, storage, and transfer systems and, in particular, to specimen carrier platforms and carousels that facilitate secure and damage-free specimen storage and handling. Another aspect of the present invention relates to scanning assemblies for detecting the presence and location of specimens supported in a carrier.

BACKGROUND OF THE INVENTION

High technology specimens such as electronic components including printed circuit boards, semiconductor wafers, electronic circuits, photomasks and the like, as well as mechanical assemblies or subassemblies, typically undergo processing and/or inspection operations. A specimen processing station is adapted to perform manufacturing, inspection, sorting, handling or other processing operations on a selected article or specimen.

A conventional semiconductor wafer fabrication process, for example, entails detection and inspection of defects in the patterned surface of a specimen wafer. The in-process inspection for defects is typically accomplished by means of a sophisticated, operator-controlled inspection station. Multiple specimens are typically loaded into a housing or carrier that is portable and may be conveyed to a processing or inspection station. Transport of the specimen carriers and loading and unloading of the specimens are frequently human-assisted operations that expose the specimens to both damage and contamination. Placement of specimens in the carrier and removal of specimens from the carrier are critical operations that frequently result in serious specimen damage. Small inaccuracies in carrier placement or specimen placement within the carrier may result in damage to the specimens, for example, from an associated automated handling system.

SUMMARY OF THE INVENTION

It is an object of the present invention, therefore, to provide an ergonomic specimen carrier carousel that facilitates secure, accurate, and automated specimen handling between the specimen carriers and a specimen processing or storage station.

Another object of the present invention is to provide a specimen carrier carousel and associated operating system that reduce the likelihood of damaged or contaminated specimens as a result of human-assisted and/or automated specimen processing or transfer operations.

A further object of the present invention is to provide a specimen carrier carousel that accommodates multiple specimen carriers and facilitates rapid, automated presentation of specimens to an associated processing station.

Still another object of the present invention is to provide a specimen carrier carousel that facilitates proper positioning of carriers on the carousel and of specimens within a carrier and provides verification of carrier positioning and condition as well as specimen presence and location to facilitate automated loading and unloading operations.

Still another object of the present invention is to provide a specimen carrier carousel that contributes to reducing contamination of specimens arranged in carriers by facilitating the flow of air in and around carriers mounted on the carousel.

Yet another object of the present invention is to provide a scanning assembly for detecting the presence and location of specimens supported in a specimen carrier.

The specimen carrier carousel of the present invention is adapted to accommodate a plurality of specimen carriers in a radial configuration and provides selectable positioning of specimen carriers at associated processing stations, storage stations, or the like. Each specimen carrier is adapted to hold a plurality of specimens in a generally stacked relationship. The carousel is designed to assist in providing accurate positioning of individual specimens within the carrier and thereby protect the specimens from damage resulting from misplacement, and to verify and correct specimen orientation prior to presenting the specimens for loading or unloading at, for example, a specimen processing station.

The specimen carrier carousel of the present invention is rotatable to selectively position specimen carriers at desired stations. Specimen carriers are automatically tilted during rotation of the carousel to properly seat the specimens within the carriers and to prevent specimen movement during rotation. A scanning assembly is provided in association with at least one carrier station to monitor and verify the presence and orientation of individual specimens within the carrier prior to commencement of unloading and/or processing operations. A subtilt assembly may be provided to correct the orientation of mispositioned specimens without requiring manual intervention or removal of carriers from the carousel. The subtilt assembly may also be used to provide more precise determinations as to the location and position of wafers in a specimen carrier.

Additional objects and advantages of the present invention will be apparent from the following detailed description of preferred embodiments, which proceeds with reference to the accompanying drawings.

BRIEF DESCRIPTION OF DRAWINGS

FIG. 2 includes phantom representations of a scanning frame in an elevated position and specimens arranged in substantially horizontal stacked positions.

FIG. 8 shows a schematic plan view of a horizontal section of the specimen carousel of the present invention taken along lines 8—8 of FIG. 2.

FIG. 9 shows a front view of a portion of a scanning frame employing an optical scanning device for verifying specimen presence and positioning.

FIG. 10 shows an enlarged plan view of a portion of the optical scanning device mounted in the scanning frame.

DETAILED DESCRIPTION OF PREFERRED EMBODIMENTS

Figure 1:
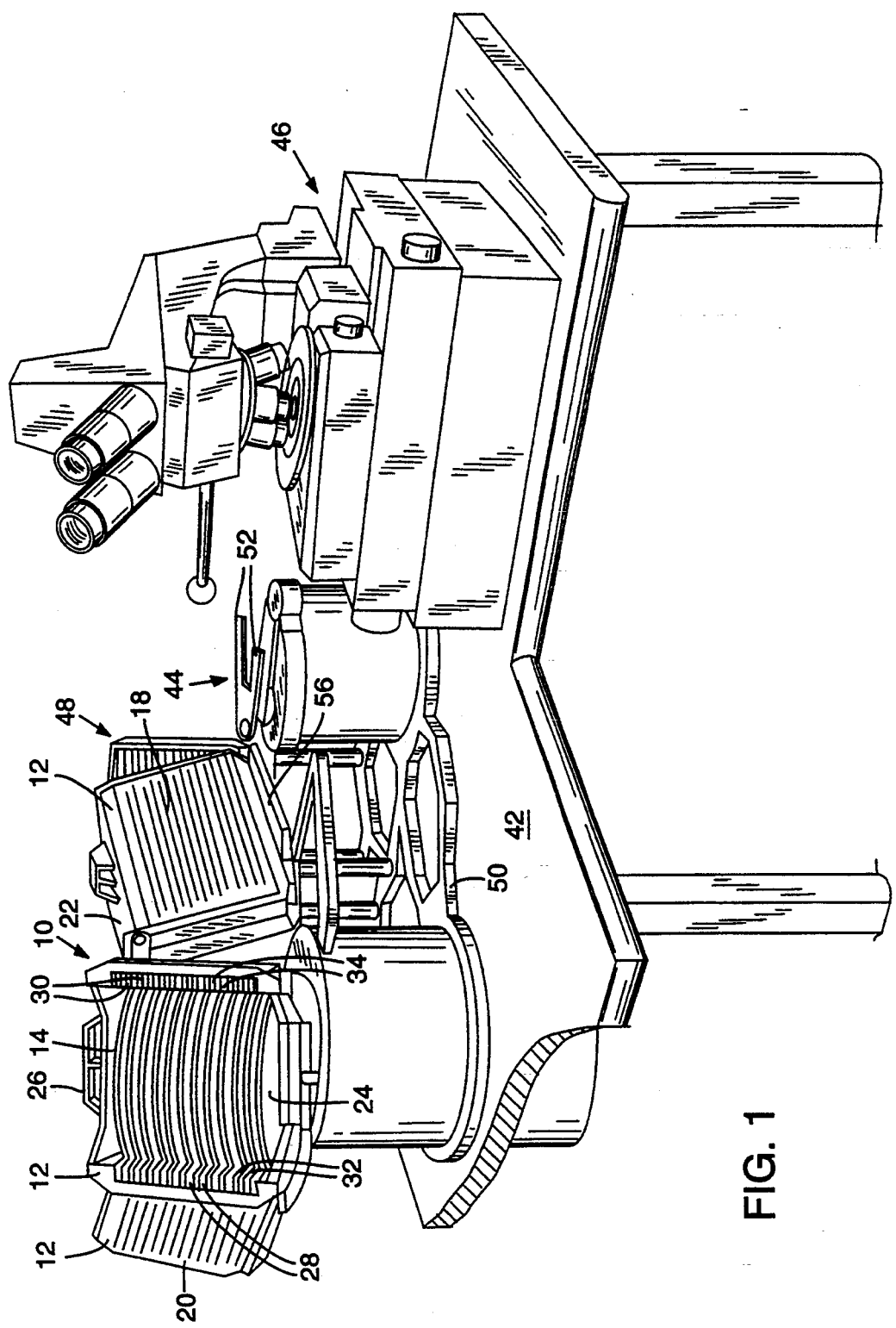
FIG. 1 shows a frontal isometric view of a specimen carrier carousel of the present invention in an operating environment wherein it is positioned adjacent an automated specimen handling mechanism for loading specimens into an exemplary specimen processing station.

FIG. 1 shows an isometric view of a preferred specimen carrier carousel 10 of the present invention in an exemplary operating environment supporting three specimen carriers 12 in a tilted condition. Specimen carriers 12 may be adapted for housing a variety of specimens, such as semiconductor wafers 14. The following description is presented herein, by way of example, with reference to specimen carriers 12 adapted for housing a plurality of semiconductor wafers 14. The specimen carrier carousel of the present invention may also be adapted for use with other types of specimen carrier or storage means housing other types of specimens.

Specimen carrier carousel 10 is preferably incorporated in an operating environment where it represents a dedicated specimen loading and unloading station. Specimen carriers 12, as shown in FIG. 1, comprise generally rectangular structures adapted to store a plurality of specimens 14 in a horizontal, stacked relationship. Specimen carrier 12 generally comprises two opposing side walls 18 and 20, and top and bottom walls 22 and 24, respectively, defining a front opening, a rear opening, and an interior space. Side walls 18 and 20 are preferably formed so that they converge toward each other near the rear opening. The rear opening is preferably smaller than the front opening, and it does not permit passage of specimens. The front opening is sized to allow insertion and removal of horizontally oriented specimens 14. Top wall 22 is provided with a handle 26 to facilitate transport and positioning of specimen carrier 12.

Specimen carrier 12 is preferably adapted to house a stack of specimens, such as generally planar semiconductor wafers, parallel to one another in a generally horizontal orientation. Interior surfaces of walls 18 and 20 are provided with a plurality of parallel spaced projections 28 and 30, respectively, forming parallel grooves 32 and 34, respectively. Each groove 32 in side wall 18 is coplanar with a corresponding groove 34 in side wall 20, such that each pair of coplanar grooves 32 and 34 forms a slot adapted to support a specimen 14. Conventionally, slots formed by grooves 32 and 34 are parallel with bottom wall 24.

As shown in FIG. 1, specimen carrier carousel 10 is mounted on table surface 42, preferably in proximity to specimen handler 44, processing station 46, and post-processing station 48. Carousel 10 and stations 46 and 48 may be connected to and centered around specimen handler 44 by means of a mounting framework 50 that maintains various components of the overall processing system in a stationary relationship with respect to the other components. In this environment, specimen handler 44 is positioned so that its robot paddle 52 can transfer specimens 14 between a specimen carrier 12 mounted on carousel 10 and a processing location at processing station 46, such as a microscope stage, another specimen carrier 12 in post-processing station 48, or another carrier 12 mounted on carousel 10. In addition to the specimen handling and processing components shown in FIG. 1, numerous other types of specimen processing, storage and transport devices are known and would be suitable for use in connection with specimen carrier carousel 10.

Specimen processing, such as semiconductor wafer processing, typically takes place in a closely controlled environment incorporating laminar air flow for reducing particulate of contamination. Specimen carrier carousel 10, as shown in FIG. 1, and the carriers mounted thereon, are designed to facilitate air flow through the carriers and across the surfaces of specimens loaded therein.

Specimen handling and processing components, including specimen carrier carousel 10, specimen handler 44, processing station 46, as well as specimen storage or post-processing components, are conventionally operated and controlled by means of a centralized, microprocessor-based control system. Many aspects of specimen handling and processing operations can be automated using such control systems. Manual or customized operation may be provided, for example, through an associated computer terminal. Sophisticated hardware and software for monitoring and controlling handling and processing components is known in the art and therefore will not be described in detail. Specimen carrier carousel 10 and other components of the specimen processing system are preferably operated, automatically or manually, by means of a control system that communicates with the components comprising the system to collect various information and that can be operated, automatically and/or manually, to manipulate various components of the specimen handling and processing system.

FIG. 1 shows a preferred embodiment of specimen carrier carousel wherein three specimen carriers 12 are mountable on carrier platforms 56 provided in a radial arrangement whereby each carrier platform (and the corresponding specimen carrier mounted thereon) is oriented approximately 120° from the other two carriers. The carrier platforms are rotatable simultaneously to position selected specimen carriers at various operational stations. For example, as shown in FIG. 1, specimen carrier 12 adjacent specimen handler 44 is at a specimen handling station wherein specimens 14 are insertable into and removable from carrier 12 by means of robot paddles 52 on handler 44. Each of the carriers 12 is sequentially positionable at the specimen handling station, for example. Additional specimen handling and/or processing stations may be provided as desired for particular applications.

Specimen carrier platforms 56 and carriers 12 are illustrated in a tilted orientation in FIG. 1 in which the carrier platforms are rotatable to selectively position a specific specimen carrier at a specific station. Specimen carrier carousel 10 of the present invention permits rotation of specimen carrier platforms only after each of the carrier platforms has been positioned in a tilted orientation. This feature facilitates proper seating of specimens in the carriers and prevents specimen shifting resulting from centrifugal forces during rotation.

After specimen platforms 56 and carriers 12 have been tilted, rotated and positioned at the desired carrier station, the specimen platforms are released from the tilted position and aligned in a specimen handling and/or processing orientation. The specimen handling and/or processing orientation is typically substantially horizontal, although certain handling or processing operations may require particular orientations, which can be provided by modifying the carrier or by maintaining a specified carrier platform tilt angle. Specimen transfer and/or scanning operations can commence only after specimen platforms 56 have been released from the tilted position maintained during rotation and positioned in the predetermined handling and/or processing orientation.

Figure 2:
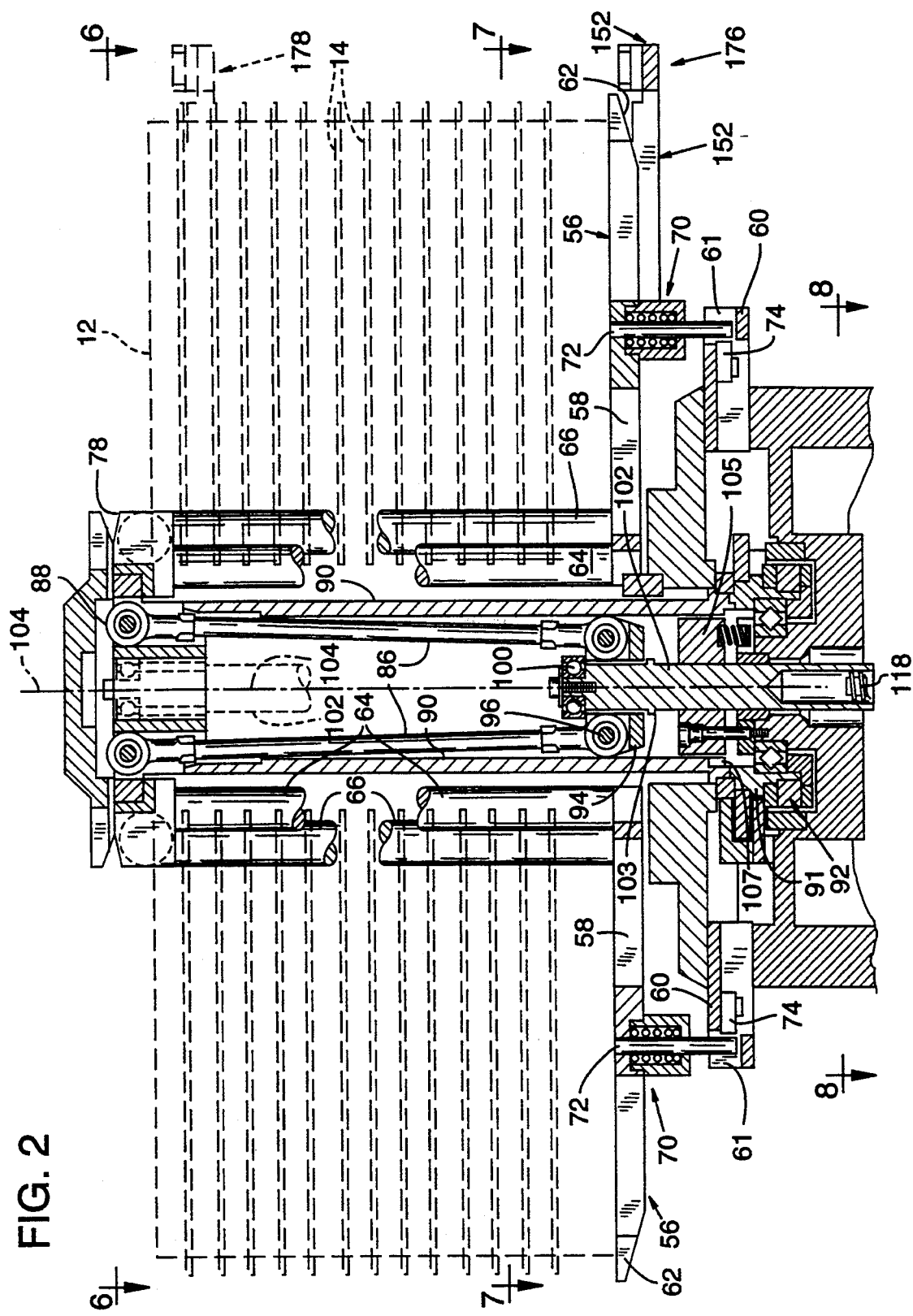
FIG. 2 shows a partially sectional side view of a vertical section passing through the center of the upper portion of a specimen carrier carousel having two specimen carrier platforms positioned 180° opposite one another in a specimen scanning and/or storage condition.
Figure 3:
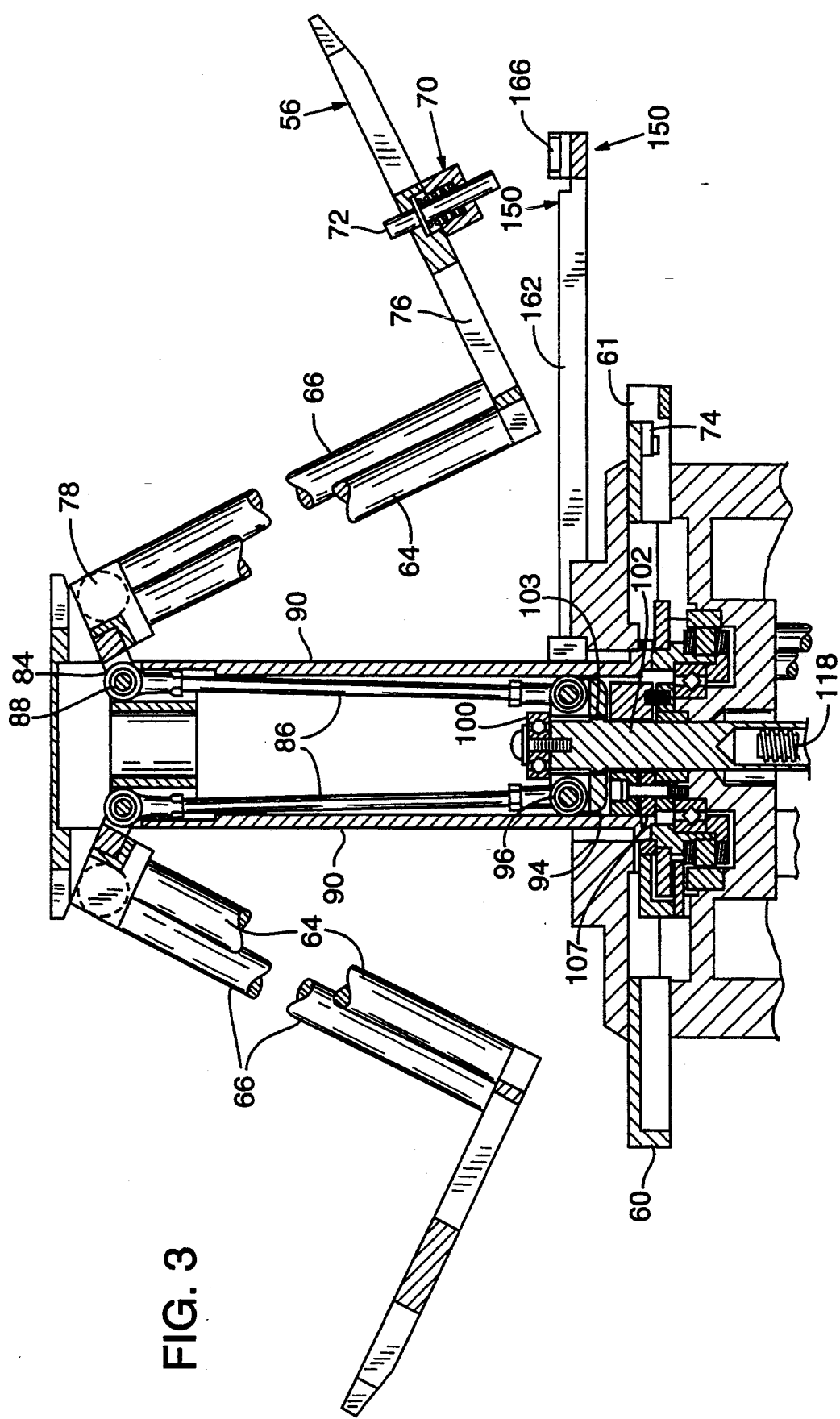
FIG. 3 shows a partially sectional side view of the upper portion of a specimen carrier carousel with the specimen carrier platforms in a tilted condition for rotation.
Figure 4:
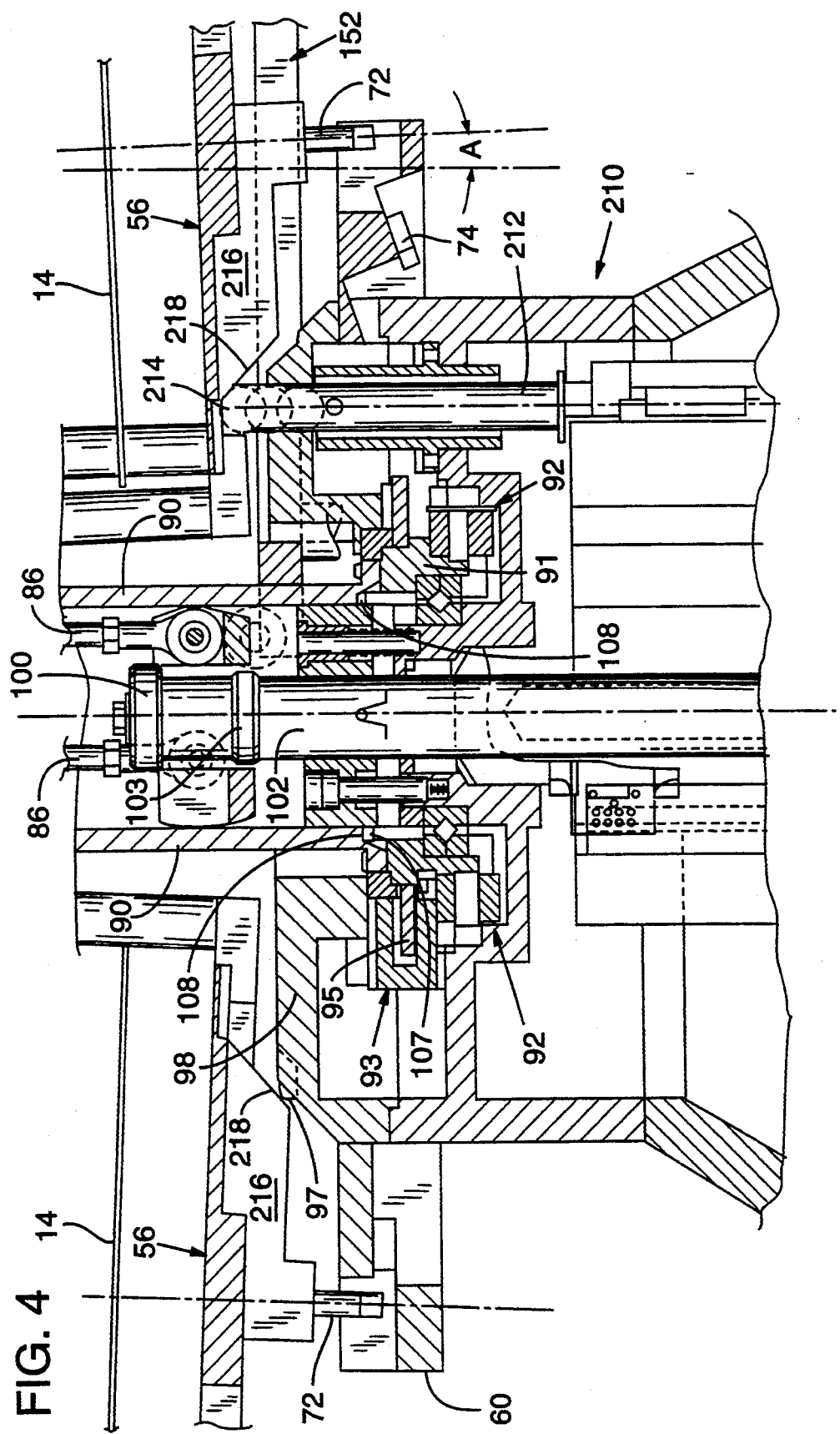
FIG. 4 shows an enlarged, partially sectional side view of a central portion of a specimen carrier carousel of the present invention.
Figure 5:
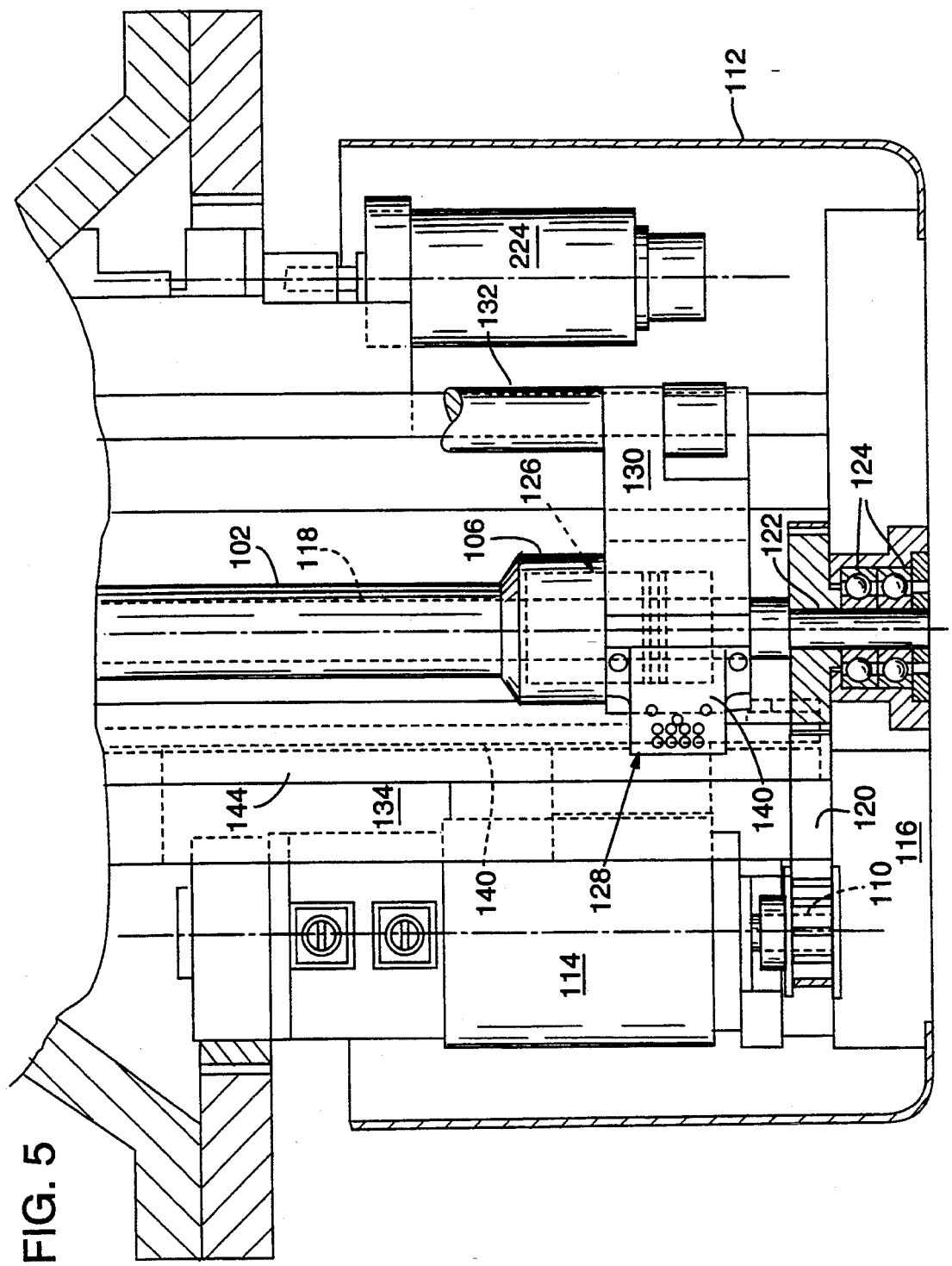
FIG. 5 shows a partially sectional side view of a vertical section passing through a lower portion of a specimen carrier carousel.

FIGS. 2-5 show partially sectional side views of various portions of carrier carousel 10. With reference to FIG. 2, two carrier platforms 56 are illustrated in a substantially horizontal, transfer and/or processing condition. Carrier platforms 56 are illustrated in a tilted condition in FIG. 3. FIG. 4 shows an enlarged view of a central portion of the specimen carrier carousel, while FIG. 5 shows an enlarged view of its lower portion.

Carrier carousel 10 preferably employs a plurality of carrier platforms 56 mounted in a fixed, radial arrangement with respect to one another, each platform being adapted to support a specimen carrier 12. Carrier carousels employing three carrier platforms are generally preferred, but fewer or more carrier platforms may be provided in a accordance with specialized requirements. For many applications, it is desirable to arrange platforms 56 in close proximity to one another, with minimal clearance provided between adjacent carrier platforms 56 when they are in a generally horizontal, specimen transfer and/or scan position. Carousel 10 thereby has a small, ergonomic footprint.

Figure 6:
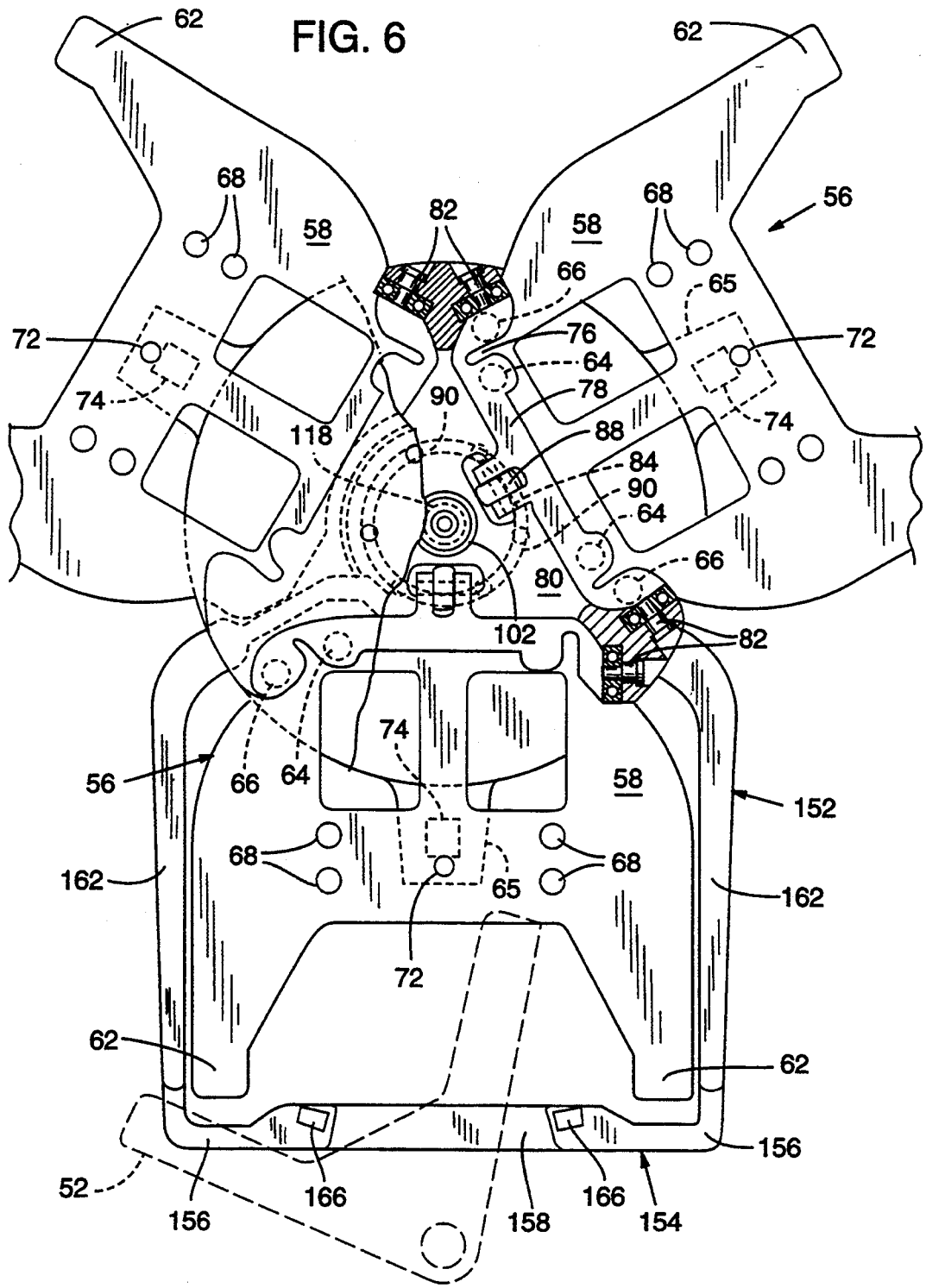
FIG. 6 shows a schematic plan view of a horizontal section of the specimen carrier carousel of the present invention taken along lines 6—6 of FIG. 2.

As shown in FIGS. 2 and 6, each carrier platform 56 comprises a generally planar cassette carrier plate 58 having a pair of end forks 62. End forks 62 are preferably beveled to facilitate clearance during tilting of the carrier platform. The peripheral profile of carrier platform 56 preferably conforms, generally, to at least a portion of the peripheral profile of specimen carrier 12. Cutouts may be provided in carrier plate 58, if desired, to reduce the weight of the assembly and to improve air flow in and around specimen carriers mounted on the carousel. Each carrier platform 56 is rigidly supported by a pair of inner and a corresponding pair of outer guide posts 64 and 66, respectively. Inner and outer guide posts 64 and 66 are preferably oriented generally perpendicular to the plane of carrier plate 58. Pivoting of guide posts 64 and 66 results in tilting of the corresponding carrier platform 56.

Projecting carrier registration pins 68 are preferably mounted on each carrier platform 56. The location of registration pins 68 corresponds to the location of registration holes or grooves (not shown) provided on the underside of bottom wall 24 of carrier 12. Cooperation of registration pins 68 with registration means provided on the bottom wall of carrier 12 facilitates precise positioning of carrier 12 on carrier platform 56.

Carrier presence indicator 70 is additionally provided on carrier platform 56. Carrier presence indicator 70 comprises a spring and plunger-type pin 72 that is biased in an elevated position. Pin 72 projects above the surface of carrier platform 56, as shown in FIG. 3, when there is no carrier 12 positioned on carrier platform 56. When a carrier is positioned on platform 56, pin 72 is depressed, as shown in FIG. 2.

A sensor 74 is positioned, for example, in slot 61 provided in a mount ring 60 located below carrier platform 56 to detect whether pin 72 is in a depressed condition. Slots 61 and sensors 74 are provided at carrier stations located at predetermined intervals around mount ring 60. Alternatively, slots 61 and sensors 74 may be provided in mounting members 65 projecting from a side wall of the carousel apparatus, as shown in FIG. 6. If pin 72 is in a depressed condition and carrier platform 56 is in a non-tilt position, as shown in FIG. 2, sensor 74 provides a signal indicating that: (1) a carrier is mounted on the carrier platform; and (2) the carrier platform is in a condition suitable for specimen scanning and/or transfer operations. Sensor 74 preferably comprises an optical sensor, but other types of sensors are known in the art and would be suitable. The control system for specimen handling and processing operations is preferably configured so that operation of the specimen scanning assembly and/or automated specimen transfer apparatus cannot be commenced until the carrier located at the scanning station is in a non-tilted, rest condition as indicated by sensor 74.

As described previously, each carrier platform 56 is supported by a pair of inner guide posts 64 and outer guide posts 66. Each pair of inner and outer guide posts supporting each carrier platform is rigidly mounted at its upper end to a pivot bracket 78. According to preferred embodiments, as shown in FIG. 6, pivot bracket 78 comprises a unitary component having a series of projections for mounting inner and outer guide posts 64 and 66, respectively. Slots 76 are formed between the projections receiving inner and outer guide posts 64 and 66, respectively, and are adapted to receive corresponding spines provided on specimen carriers 12 to facilitate proper location of carriers 12 on carrier platforms 56.

A pivot bracket support member 80 supports each end of each pivot bracket 78 by means of tilt pivots 82 and pivot bracket support member 80. Tilt pivots 82 are shown in FIG. 6. The pivot axis of each pivot bracket 78 and, consequently, each carrier platform 56, is thus defined by the axes of tilt pivots 82. Pivot bracket support members 80 are rigidly mounted on or form a part of a structural support member of the carrier carousel and rotate during carrier positioning, but otherwise remain stationary during carousel operation.

A central portion 84 of each pivot bracket 78 is pivotally connected to a tilt actuating rod 86 by means of an upper spherical rod end bearing 88. Tilt actuating rods 86 are shown in FIGS. 2 and 3 and control the orientation of carrier platforms 56 by means of their pivotal attachment to pivot bracket 78. Each tilt actuating rod 86 is also pivotally mounted to a common tilt actuating ring 94 by means of a lower Heim joint 96. Tilt actuating ring 94 is sized and located within main support tube 90 and its outer peripheral surface is located adjacent the inner wall of main support tube 90. Displacement of tilt actuating ring 94 within main support tube 90, e.g., lowering the tilt actuating ring, results in tilting of carrier platforms 56.

An upper surface of tilt actuating ring 94 cooperates with an actuating bearing 100 mounted on or forming part of a central rod 102. Central rod 102 is aligned on the central vertical axis 104 of carrier carousel 10 and extends through main support tube 90. As central rod 102 is lowered, bearing member 100 contacts tilt actuating ring 94 and causes it to be lowered correspondingly. Displacement of tilt actuating ring 94 results in displacement of tilt actuating rods 86 and tilting of carrier platforms 56. Carrier platforms 56 are thus tilted and returned to a substantially horizontal specimen scanning and/or processing position in response to vertical displacements of central rod 102.

FIG. 2 illustrates carrier platforms 56 in a non-tilted, substantially horizontal scanning and/or transfer condition. FIG. 3 illustrates central rod 102 and tilt actuating rods 86 in a vertically displaced (i.e. lowered) condition resulting in positioning of carrier platforms 56 in a tilted condition. Tilt angles of carrier platforms 56 from the horizontal of from about 5° to about 60° are preferred, and tilt angle of about 30° is especially preferred. Carrier platforms 56 and the specimen carriers mounted thereon are rotatable when in the tilted condition.

FIG. 4 illustrates a preferred embodiment wherein a subtilt mounting member 216 is provided on the underside of carrier platforms 56. In the substantially horizontal scanning and/or transfer condition of carrier platforms 56, ramp 218 of mounting member 216 may rest on a resilient support member 97 mounted on main carrier 98. Resilient support member 97 may be located and sized to support carrier platforms 56 in a position that is slightly tilted from the horizontal. Resilient support member 97 also provides a cushioned surface that reduces movement of specimens loaded in carriers 12 during positioning in the substantially horizontal scanning and/or transfer condition.

A locking mechanism is preferably incorporated to provide positive locking of main support tube 90 in a stationary condition during scanning and/or processing operations, and to release main support tube 90 during or after tilting of carrier platforms 56. According to preferred embodiments, central rod 102 is provided with an enlarged annular ring 103 spaced a distance below actuating Bearing 100. Linear displacement of central rod 102 downwardly from the position shown in FIGS. 2 and 4 results, first, in actuating bearing 100 contacting tilt actuating ring 94 and displacing tilt actuating ring 94 and tilt actuating rods 86 to tilt carrier platforms 56. Further downward displacement of central rod 102 results in contact between enlarged annular ring 103 and an indexing ring 105. Indexing ring 105 is slidably mounted on central rod 102 and is preferably biased in an upper position that maintains main support tube 90 in a locked condition.

Indexing ring 105 is provided with a plurality of detents 107 projecting from its peripheral surface. The lower, inner wall of main support tube 90 has a plurality of detent grooves 108 provided corresponding to predetermined processing locations. Detents 107 are seated in grooves 108 and serve to retain main support tube 90 in a stationary condition at all times that indexing ring 105 is in its upper position, such as scanning operations. Detent grooves 108 preferably have sloped sidewalls that facilitate precise seating of detents 107 in the stationary condition of main support tube 90. When central rod 102 is lowered, however, enlarged annular ring 103 contacts and lowers indexing ring 105 to releases detents 107 from grooves 108 in the lower surface of main support tube 90. In this released condition, main support tube 90 is free to rotate and thereby position carriers 12 mounted on carrier platforms 56 at desired processing and/or storage stations.

Main support tube 90 is rigidly mounted to spindle 91. When main support tube 90 is in a released condition and is rotatable, actuation of rotary motor 92 mounted on spindle 91 results in rotation of main support tube 90, and hence carrier platforms 56. Activation and operation of rotary motor 92 is preferably controlled by the central control system.

Rotary motor 92 is preferably provided with a high precision read head assembly 93 that cooperates with rotary scale 95 to continuously monitor the rotary position coordinates of spindle 91 and hence main support tube 90. Precise rotary position monitoring is required to accurately position carrier platforms 90 at predetermined processing and/or storage locations and to properly align components of carrier presence detectors 70 with sensors 74. Suitable rotary motors and rotary position monitoring assemblies are known in the art.

After main support tube 90 has been rotated to position carriers 12 mounted on carrier platforms 56 at desired processing and/or storage stations, central rod 102 is displaced upwardly to reposition enlarged annular ring 103 and indexing ring 105 in an upper position. Detents 107 are thereby seated in corresponding grooves 108 in the base of main support tube 90 to once again lock main support tube 90 in a stationary condition. As central rod 102 is displaced further upwardly, actuating bearing 100 and tilt actuating ring 94 are raised and carrier platforms 56 are consequently lowered to their processing and/or scanning orientations. Further upward displacement of central rod 102 results in commencement of the scanning operation and displacement of specimen scanning assembly 150 to effect scanning of specimens mounted in the carrier located at a specimen scanning station.

Central rod 102 is vertically displaced in response to electrical signals input to a linear actuator device. A central rod actuating assembly is housed within base 112 of specimen carrier carousel 10 and functions to vertically displace central rod 102 in both directions along central axis 104. According to preferred embodiments, the central rod actuating assembly operates according to the principles of high precision linear actuators. A preferred linear actuator is disclosed in commonly assigned U.S. Pat. No. 5,053,685. Alternative means for displacing central rod 102 in response to various electrical inputs are known in the art and would be suitable.

A preferred embodiment of a central rod actuating assembly is illustrated in FIG. 5. The central rod actuating assembly preferably includes a smooth running, high torque, DC motor drive 114 mounted on base mounting member 116. Numerous servo motors are known in the art, are commercially available, and would be suitable. Motor drive 114 is in communication with and controlled by an input controller that generates input command voltage signals. The input controller forms part of the central control system. Input command signals delivered to motor drive 114 are converted to rotation of motor drive output shaft 110. Motor drive 114 provides bidirectional rotational output, reflecting the polarity of the voltage input signal. The actuating assembly thereby produces bidirectional linear displacements of central rod 102 in response to the polarities of voltage input signals.

Motor drive output shaft 110 is operably connected to a spindle 122 mounted at or forming a lead screw 118. Rotation of motor drive output shaft 110 results in corresponding rotation of spindle 122 and lead screw 118. Spindle 122 is mounted in base mounting member 116 by means of bearings 124 facilitating high fidelity rotation of spindle 122. Motor drive output shaft 110 and spindle 122 are preferably directly coupled by means of a drive belt 120. According to preferred embodiments, a lead nut assembly 126 is threaded on lead screw 118 and operably connected to central rod 102. Rotation of lead screw 118 therefore results in linear displacement of lead nut assembly 126 along the length of lead screw 118, which results in linear displacement of central rod 102 to effect tilting, rotation and scanning operations.

High fidelity mechanical linkages serve to immediately and precisely translate the rotation of motor drive output shaft 110 induced by voltage input signals to linear displacement of lead screw 118 and central rod 102. Moreover, as a consequence of the high fidelity mechanical linkages provided in the actuating assembly, the load does not influence the accuracy, repeatability or resolution of linear displacements. Additionally, the actuating assembly preferably has a large force constant, which permits it to move in small, precise increments, thus providing high accuracy and resolution.

The central rod actuating assembly controls pivoting of carrier platforms 56 and indirectly controls rotation of main support tube 90 by placing main support tube 90 in a stationary, locked condition or in a rotatable, released condition. The central rod actuating assembly additionally controls displacement of the specimen scanning apparatus, which is described in greater detail below. Closed loop control of the central rod actuating assembly and the linear displacement output it generates is important in high precision applications such as semiconductor wafer processing.

A preferred means for providing closed loop control involves utilization of optical encoder assembly 128 to continuously monitor and provide feedback as to the position of lead nut assembly 126 and central rod 102. Encoder carriage 130, as shown in FIGS. 5 and 9, is mounted in fixed relation to and thus moves in concert with lead nut assembly 126 and central rod 102. Encoder carriage 130 provides a housing for movable components of the encoder assembly, as well as a mounting member for scanning frame guide rods 132 supporting the scanning frame. The scanning assembly is thereby displaced as a consequence of the displacement of encoder carriage 130 resulting from rotation of lead screw 118.

Encoder carriage 130 is slidably mounted on stationary vertical support plates 134 and 136 by means of high precision, low friction linear bearing assemblies 138 arranged parallel to central axis 104. Linear bearing assemblies 138 preferably extend for the full length of travel of lead nut assembly 126 and thereby positively guide encoder carriage 130 along the full length of its travel path.

Various types of position encoders and means for continuously monitoring and providing feedback relating to the displacement of lead nut assembly 126 and encoder carriage 130 are known in the art and would be suitable. Optical encoder assemblies are generally preferred, and encoders that operate utilizing Moire fringe pattern principles to continuously monitor the position of encoder carriage 130 are especially preferred.

Encoder assembly 128 preferably comprises a plurality of light sources, such as an array of light emitting diodes (LEDs) mounted on and penetrating a read head mounting member 140. Read head mounting member 140 is rigidly mounted to or formed as a unit with encoder carriage 130, and the light sources are operably connected to a suitable energy source. A plurality of light sensors is also mounted on read head mounting member 140 and positioned opposite the light sources. Suitable light sensors are capable of measuring light intensity, and individual sensors are arranged substantially aligned with and opposite individual light sources. The light sensors are capable of conveying a signal representative of light intensity to a controller.

A reference grating is rigidly mounted on read head mounting member 140 interposed between the array of light sources and light sensors. A stationary grating 144 is mounted in fixed relationship with respect to and also interposed between the array of light sources and light sensors. Stationary grating 144 extends for the full length of travel of encoder carriage 130. Both stationary and reference gratings are preferably provided with identical Moire grating patterns. Displacement of the reference grating mounted on read head mounting member 140 relative to stationary grating 144, provides Moire light pattern information relating to the position of read head mounting member 140, and thereby encoder carriage 130 and central rod 102.

To continuously monitor the position of encoder carriage 130, the array of light sources is energized and light is directed through the reference grating toward stationary grating 144 and the array of light sensors. When the grating patterns on the reference and stationary gratings are aligned, light penetrates both gratings and high intensity light impinges on the sensors. When the reference grating, along with encoder carriage 130 and central rod 102, is linearly displaced by a distance defined as one half of a grating period (a grating period being defined as the distance between adjacent grating pattern lines), the intensity of light passing through the reference and stationary gratings and impinging on the light sensors has a minimum or null value. When the light intensity is between intensity maxima and minima, the intensity varies as a known function of linear distance traveled by grating lines of the reference grating between next adjacent grating lines of stationary grating 144. The number of intensity maxima and minima detected by the sensors is indicative of the linear distance traveled by encoder carriage 130, and thereby their positions. Grating period counts may be obtained from any reference starting point, with a single period being equivalent to the distance between measurements of light intensity equal to the light intensity at the starting point.

Use of Moire fringe patterns for measuring linear displacements is generally known in the art. Although linear displacement measurements based upon Moire fringe pattern principles are preferred to provide position feedback and monitoring during linear actuator operation according to the present invention, alternative feedback and monitoring systems may also be adopted.

Figure 7:
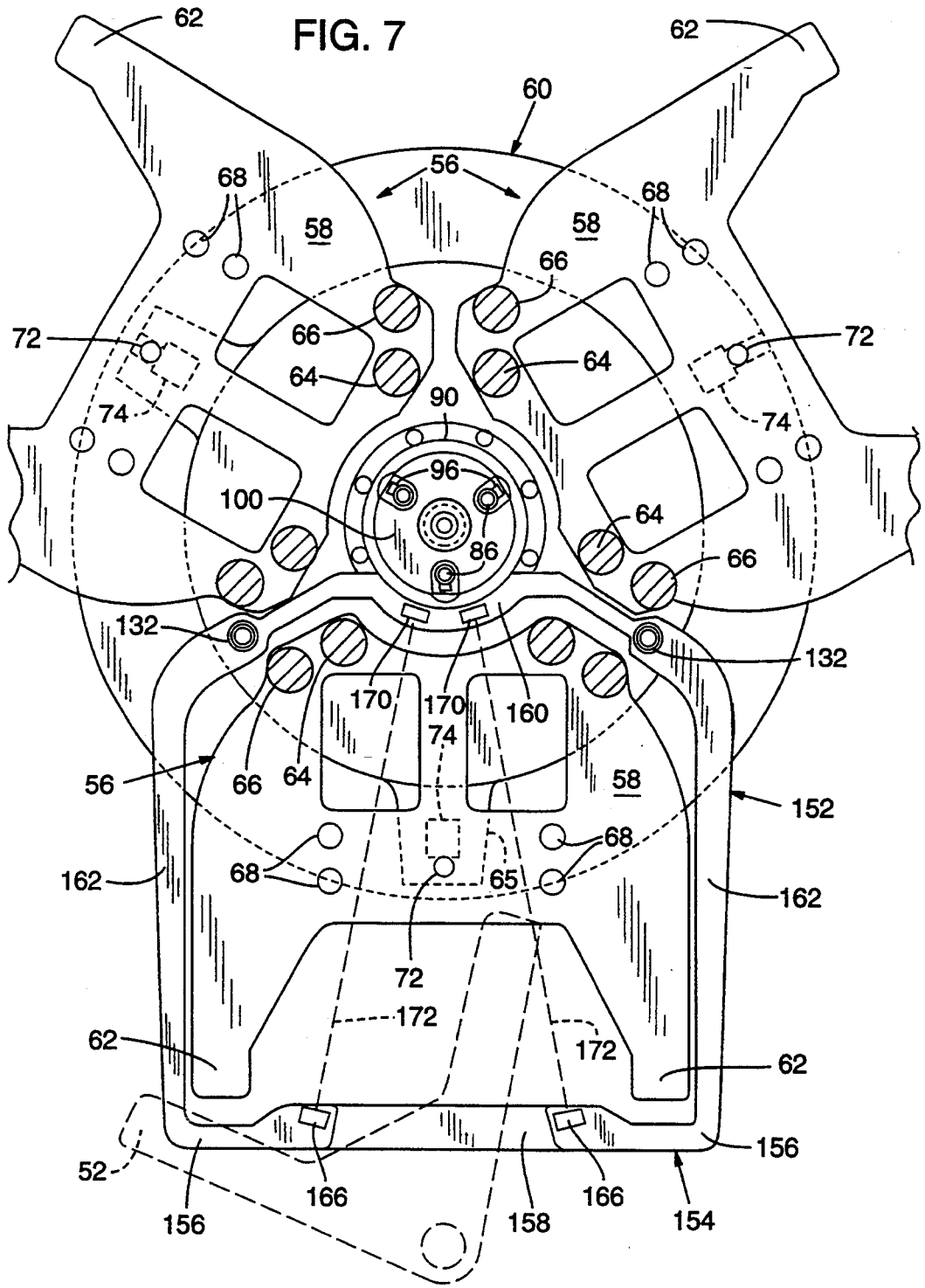
FIG. 7 shows a schematic plan view of a horizontal section of the specimen carousel of the present invention taken along lines 7—7 of FIG. 2.

A specimen scanning assembly 150 is rigidly connected to encoder carriage 130 through scanning frame guide rods 132 such that scanning assembly 150 is linearly displaced in response to output generated by motor drive 114. Scanning assembly 150 is thereby linearly displaced in concert with encoder carriage 130 and lead nut assembly 126. FIGS. 6 and 7 show top views of specimen scanning assembly 150 mounted at a specimen scanning and/or processing station. Typically, the scanning function is provided at a single carrier carousel station, but scanning assemblies may be provided at multiple carrier carousel stations if desired.

Scanning assembly 150 comprises a generally rectangular scanning frame 152 that conforms generally to the outer peripheral configuration of carriers 12 and is sized to traverse a path outside a carrier 12 positioned at the scanning station. Scanning frame 152 includes a distal segment 154 between distal corners 156; a U-slot 158 formed in a central region of distal segment 154; a proximal, central arcuate portion 160 that conforms generally to the configuration of and is slidable in relation to main support tube 90; and two side segments 162.

With reference to FIG. 7, scanning assembly 150 preferably employs at least two signal sources 166, such as optical signal sources, positioned on distal segment 154 on either side of U-slot 158. Corresponding signal detectors 170 are positioned on arcuate portion 160 to receive signals propagated along signal paths 172. Thus, when a specimen carrier 12 is positioned on a carrier platform 56 located at a designated scanning station equipped with scanning assembly 150, signal sources 166 are positioned outside the front opening of carrier 12 mounted on carrier platform 56 and signal detectors 170 are positioned "behind" the rear opening at carrier 12 in proximity to main support tube 90. Although this configuration is preferred, the location of the signal sources and detectors may be reversed, with the signal sources provided on arcuate portion 160 and the signal detectors provided on distal segment 154. Alternatively, a single scanning signal source could be used in combination with signal detectors for receiving the scanning signals. Any signal source or combination of signal sources that provides more than a single data point relating to specimen location may be used in scanning assembly 150.

Linear displacement of encoder carriage 130 caused by rotation of lead screw 118 results in linear displacement of scanning frame 152 between an initial position 176 and a displaced position 178, for example, as illustrated in FIG. 2. As scanning frame 152 is linearly displaced, specimens 14 positioned in carrier 12 interrupt signals propagated along signal paths 172. Signal interruption information provided by detectors 170 in combination with position information provided by optical encoder assembly 128 can be processed to provide a map of the location and orientation of specimens 14 within carrier 12.

The operating system can be programmed to "expect" signal interruptions of a predetermined magnitude at incremental positions corresponding to specimen storage locations in carrier 12. Comparison of the scanning information with the programmed values thereby indicates the absence or presence of a specimen 14 at each specimen storage location in carrier 12. Moreover signal interruption information can be used to determine the orientation of given specimens 14.

Thus, during a scanning operation, if the position coordinates derived from the optical encoder assembly are of equal value and signal interruption values derived from each signal source and detector pair are equal to a predetermined value for specimen thickness, specimen 14 is properly oriented and handling and/or processing can be commenced. If, however, the signal interruption values indicate measured values that exceed the predetermined thickness values, the specimen is at a tilt or other unfavorable condition, and the operating system can alert the operator or otherwise modify the handling and/or processing operation. Likewise, if the position coordinates and/or signal interruption values are of unequal value and/or different from predetermined values, the specimen is improperly oriented. The scanning assembly can therefore be used to identify improper load conditions that occur when, for example, two or more specimens are positioned in the same slot, or specimens are cross-slotted or otherwise misaligned.

The use of two or more corresponding signal sources 166 and signal detectors 170 permits scanning assembly 150 to collect information that can be processed to determine the presence or absence of a specimen 14 in each specimen storage location in carrier 12, the datum plane of each specimen 14, and the roll angle and pitch axis of specimens stored in carrier 12. The scanning assembly can, moreover, be used to detect faulty carriers by scanning portions of the carrier itself, or through a process of specimen position correction and repeated scanning. If, for example, a scanning operation indicates that a specimen is slightly tilted (but not cross-slotted), and a correction cycle does not correct the specimen positioning, the positioning error most likely results from a faulty carrier. Faulty carriers can thus be identified and replaced, if necessary.

Information collected by the scanning assembly can be processed by the central processing system and used by an operator to customize the handling, processing and/or storage operations. Alternatively, or additionally the specimen presence and orientation information may be used to customize and accommodate specialized specimen and/or carrier conditions.

Calibration of the specimen scanning assembly may be accomplished using other components of the specimen processing and/or storage system. In a system using an automated specimen handler 44, for example, as shown in FIG. 1, robot paddles 52 of specimen handler 44 may be utilized to calibrate the scanning assembly. Calibration of the scanning assembly with reference to a specimen handler may thus be accomplished by inserting robot paddles 52 through U-slot 158 in scanning frame 152 and adjusting the robot paddle until one of the signal paths 172 is interrupted. Because robot paddles 52 have a predetermined thickness, and their vertical position coordinates are continuously monitored, various determinations concerning the position of scanning frame 152 and its rate of travel can be made and used by the operating system.

Computer software interfacing with the scanning optical encoder assemblies may be programmed to precisely monitor the position and orientation of specimens positioned in a carrier being scanned. The handling and/or processing system can thus be inactivated or programmed to accommodate the specimens identified as improperly oriented in carrier 12. Similarly, the handling and/or processing system can be programmed to efficiently handle or process specimens in carriers that are only partially loaded. This alleviates the problems of many prior art processing systems that require fully loaded specimen carriers for operation.

Propagation of signals from signal source 166 to signal detector 170 in the environment described above may require a specialized signal source that reduces light scattering and deflection along signal path 172. The spaces between adjacent specimens in carrier 12 may be quite narrow, and light scattering and deflection along signal path 172 distorts the signal reaching detectors 170. Light scattering and deflection along signal path 172 can be reduced by providing a light source that is substantially collimated so that substantially all of the light emitted at signal sources 166 is conveyed along a rectilinear path to signal detectors 170. Light sources providing an angle of divergence that is relatively low, preferably from about 0.8° to about 3°, and most preferably about 1.4°, are preferred.

FIG. 10 illustrates an exemplary preferred embodiment for propagating a substantially collimated optical signal to produce improved signal detection. Source 180 is mounted in a recess machined or otherwise provided in distal segment 154 of scanning frame 152 and propagates a light beam along path 182. The light beam first passes through a narrow entrance 184 to elongated chamber 186 formed, for example, by a recessed groove in distal segment 154 of scanning frame 152. The light beam subsequently traverses a series of notches 188 formed between recesses 190 and a groove 192 before impinging on reflective surface 196.

Elongated chamber 186, notches 188, recesses 190 and groove 192 may have a variety of configurations and desirably embody various dimensions, all designed to produce a collimated light beam impinging on reflective surface 196. Generally, the beam path is progressively narrowed as it approaches reflective surface 196 to produce a substantially collimated beam. The beam is reflected along pathway 198 formed, for example, by a groove in scanning frame 152 and then traverses signal path 172 to signal detector 170. During operation of the scanning assembly, caps 200 are mounted on scanning frame 152 to enclose light sources 180 and the associated beam pathway structures and reflective surfaces. The interior surfaces of caps 200 are preferably provided with notches, recesses, grooves, and the like corresponding to those provided in distal segment 154 of scanning frame 152.

Specimen carrier carousel 10 may additionally be provided with a subtilt assembly in connection with a specimen scanning, handling and/or processing station. The subtilt assembly functions to provide tilt adjustments of a carrier positioned at the scanning, transfer and/or processing position of carrier platform 56. Minor tilt adjustments may serve to properly seat or position specimens within the carrier during or as a part of the scanning operation and thereby provide an in-process specimen position correction mechanism. Moreover, carrier platforms 56 may be "parked" in the subtilted condition whenever there is an interruption in operations.

One advantage of providing subtilt capability is that specimens detected as improperly positioned during the scanning operation may be adjusted and seated in the proper orientation without requiring manual intervention or removal of the carrier from the carrier platform. Specimen scanning, transfer and/or processing may then proceed and processing efficiency and throughput is thereby substantially enhanced.

Figure 11:
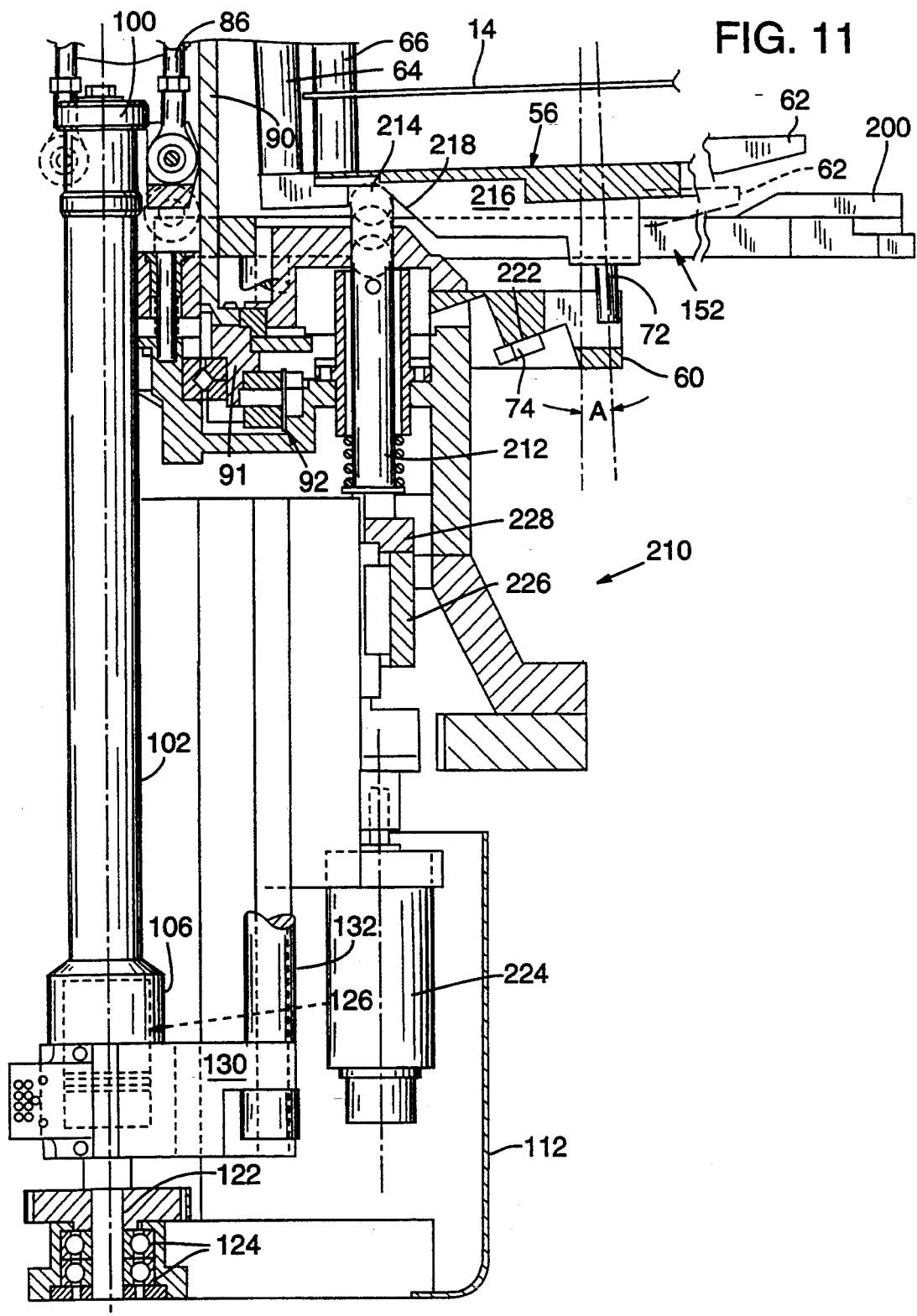
FIG. 11 is an enlarged partially cross-sectional side view of a preferred embodiment of a carrier platform and subtilt assembly mounted at a carrier scanning station.
Figure 12:
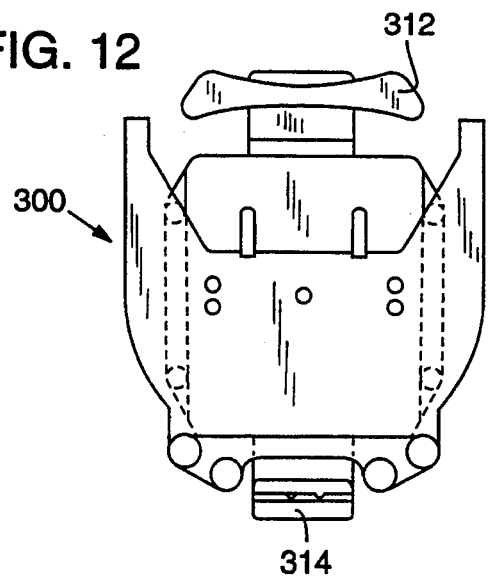
FIG. 12 illustrates a top view of a specimen carrier platform of the present invention having a scanning assembly for detecting the presence and location of specimens in a specimen carrier.

A preferred embodiment of a subtilt assembly is illustrated in detail in FIG. 11. Carrier platform 56 is shown in FIG. 12 in a subtilted condition, with the end fork 62 shown in dashed lines indicating the substantially horizontal, scanning, transfer and/or processing condition of carrier platform 56. Subtilt angles (A) of about 2° to about 3° from the substantially horizontal condition are especially preferred. Although the subtilt assembly is illustrated tilting carrier platform 56 in an upward direction, the subtilt assembly also has the capability of tilting carrier platform 56 toward a downward position, indicated as a subtilt angle (−A) of about 2° to about 3°.

The subtilt assembly 210 comprises a slidable subtilt push rod 212 having a subtilt actuator 214, such as wheel, that cooperates with a mounting member 216 provided on the underside of carrier platform 56. Specifically, displacement of subtilt push rod 212 along its longitudinal axis toward carrier platform 56 causes subtilt actuator 214 to traverse ramp 218 on subtilt mounting member 216 and thereby tilt the carrier platform. In the lowest position of subtilt actuator 214 shown in FIG. 11, the carrier platform is in a substantially horizontal condition and subtilt angle A is 0°. Intermediate positions of subtilt actuator 214 provide intermediate subtilt angles.

Sensor 74 is preferably mounted on an inclined sensor mounting surface 222 forming part of the mount ring to accommodate the subtilt position of carrier platform without changing the status of carrier presence detector 70. Additionally, signal sensor 74 mounted at a station incorporating a subtilt assembly is preferably modulated to reduce signal background levels.

Subtilt push rod 212 is preferably biased in a non-tilt, lower position, but is displaceable along its longitudinal axis by means of a linear actuator device. Motor drive 224 produces rotational output in response to electrical signals generated by an input controller. Although it may be unnecessary to provide extensive monitoring and control functions in connection with the actuation of subtilt assembly 210, the linear actuator device may be provided with a position encoder similar to optical encoder assembly 128. Rotational output of motor drive 224 is translated to linear displacement of subtilt carriage 226 and striker cap 228, which results in corresponding linear displacement of subtilt push rod 212. Subtilt carriage 226 and subtilt push rod 212 are preferably supported by high precision, low friction linear bearing assemblies.

The subtilt assembly described above may also be used to provide information for more precisely identifying the location of specimens supported in a specimen carrier. It is especially useful for detecting when two or more specimens, i.e. wafers, are positioned in the same wafer slot. Such double-slotted wafers are otherwise very difficult to detect and to distinguish from wafers that are tilted within the carrier water slots. According to preferred embodiments, the subtilt assembly permits selectable positioning of the scanning assembly, the carrier platform and a carrier supported on the platform at various tilt angles. The scanning operation may thus be conducted when the carrier is positioned at different tilted orientations. Using a scanning assembly to detect the presence and location of specimens in a carrier when the carrier is positioned at two or more different tilt orientations dramatically enhances the precision of specimen location data and identification of improper specimen load conditions.

In accordance with this preferred embodiment, a scanning operation to collect two specimen location data sets requires at least two passes of scanning assembly 150 along a scanning path, with carrier platform 56, and hence carrier 12 and specimens 14, positioned at different tilted orientations during each scanning pass. Multiple scanning passes may easily be accommodated, for example, by locating the carrier platform 56 (and thus the carrier 12 and specimens 14) at a first tilt angle; moving scanning assembly 150 and carrier 12 relative to one another to collect a first signal interruption data set; locating scanning assembly 150 and carrier platform 56 (and hence carrier 12 and specimens 14) at a second tilt angle; and moving scanning assembly 150 and carrier 12 relative to one another to collect a second signal interruption data set. The difference between the first and second tilt angles may be relatively small, i.e., on the order of about 0.5° to about 5°. Either of the tilt angles may be 0°, corresponding to a horizontal orientation. Collection of multiple signal interruption data sets by providing more than two passes of the scanning assembly along the scanning path when the specimens are oriented at different tilt angles provides more precise specimen location information.

As described previously, the operating system can be programmed to expect signal interruptions of a predetermined magnitude at incremental locations corresponding to specimen storage locations in carrier 12. Comparison of specimen position coordinates derived from a signal interruption data set collected by the scanning assembly with predetermined values for specimen thickness thus provides information as to the location of specimens in the carrier. When two signal interruption data sets are collected at different known tilt angles, more precise information as to the location of specimens within the carrier can be derived. Notably, more precise information generated from two or more signal interruption data sets collected at different known tilt angles reduces the number of false messages or triggers indicating specimen misalignment.

Although the specimen carrier carousel of the present invention has been described herein with reference to certain orientations—i.e.—horizontal, vertical, upper, lower, and the like, these orientations have been specified with reference to the drawings for the sake of convenience, and the specimen carrier carousel and constituent components are not limited in this fashion. Suitable motor drives and control components are well known in the art and may be adapted for use in the present invention.

Figure 13:
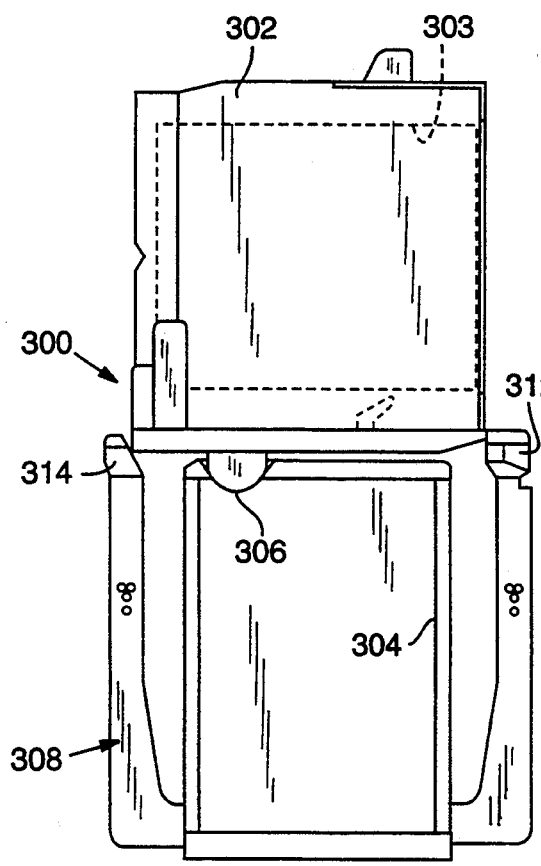
FIG. 13 illustrates a side view of the specimen carrier platform shown in FIG. 13 with the scanning assembly located at a lowermost scan position.
Figure 14:
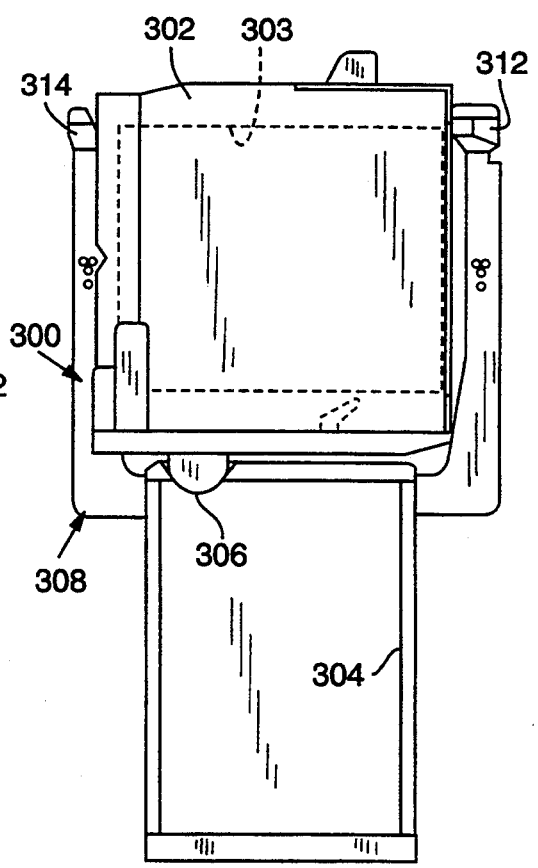
FIG. 14 illustrates a side view of the specimen carrier platform shown in FIG. 13 with the scanning assembly located at an uppermost scan position.

Although the invention has been described and illustrated with reference to a specimen carrier carousel, it will be understood that many of the advantages of the present invention may be realized using a single carrier station or platform. A single carrier platform embodiment is shown at FIGS. 12–14. Carrier platform 300 is adapted to receive and hold specimen carrier 302. Specimens are aligned in a stacked fashion generally parallel to line 303. Carrier platform 300 is mounted on pedestal 304 and is tiltable with respect to pedestal 304 by means of tilt mechanism 306. Carrier platform 300 may alternatively employ a tilt and/or subtilt mechanism as described previously with reference to the carousel.

Scanning assembly 308 is provided to scan the location of specimens mounted in carrier 302 and provide data as to the presence and location of specimens mounted in carrier 302. Scanning assembly 308, according to a preferred embodiment, operates in substantially the same fashion as scanning assembly 150 described previously. Scanning assembly 308 may be provided in a generally U-shaped configuration, with signal source arm 312 and signal detector arm 314 sized and configured to travel a scanning path generally perpendicular to the planar alignment of specimens supported in carrier 302. Movement of the scanning assembly and collection of signal interruption data may be accomplished as described above with reference to scanning assembly 150. Scanning assembly 308 is illustrated in the lowermost position in FIG. 13 and in the uppermost position in FIG. 14. Other types of scanning assemblies may also be employed, provided that they collect information as to the presence and location of specimens in a carrier or other storage, transport or processing device.

Carrier platform 300 may be provided with many of the features described above with reference to specimen carrier carousel 10, including the subtilt assembly. Using the scanning assembly and manipulating the tilt orientation of specimen carrier 302, precise information as to the presence and location of specimens in a carrier can be derived, as described above. Double-slotted specimens may thereby be accurately identified prior to subsequent handling and/or processing that may otherwise result in damage to the specimens.

It will be obvious to those having ordinary skill in the art that various changes may be made in the details of the above-described preferred embodiment of the present invention without departing from the underlying principles thereof. The scope of the present invention should, therefore, be determined only by the following claims.

We claim:

1. A specimen carrier carousel comprising:
   a plurality of tiltable carrier platforms arranged in a radial configuration, each carrier platform adapted to support a specimen carrier having specimens positioned therein in a first orientation wherein the specimens are aligned on a first plane and a second, tilted orientation wherein the specimens are aligned on a second plane tilted from the first plane; and
   means for adjusting the carrier platforms between the first and second orientations.

2. A specimen carrier carousel according to claim 1, additionally comprising means for rotating the carrier platforms about a central carousel axis.

3. A specimen carrier carousel according to claim 2, wherein the first plane is generally horizontal and the second plane is tilted from horizontal, and the means for rotating the carrier platforms is actuatable only when the carrier platforms are in the second, tilted orientation.

4. A specimen carrier carousel according to claim 2, wherein the means for rotating the carrier platforms is a common rotation means that rotates each of the carrier platforms simultaneously.

5. A specimen carrier carousel according to claim 1, wherein the means for adjusting the carrier platforms is a common tilt adjustment means that adjusts each of the carrier platforms simultaneously.

6. A specimen carrier carousel according to claim 1, wherein the second plane is tilted from the first plane by about 5° to about 60°.

7. A specimen carrier carousel according to claim 6, wherein the second plane is tilted from the first plane by about 30°.

8. A specimen carrier carousel according to claim 1, comprising three specimen carrier platforms.

9. A specimen carrier carousel according to claim 1, additionally comprising a scanning assembly having a signal source and a corresponding signal sensor adapted to scan specimens arranged in a stacked relationship in a specimen carrier supported on a carrier platform and detect the presence and location of specimens in the carrier.

10. A specimen carrier carousel according to claim 9, wherein the scanning assembly comprises at least two signal sources, each signal source adapted to propagate a signal along a signal path, and at least two corresponding signal sensors, each signal sensor adapted to intercept the signal propagated by the respective signal source.

11. A specimen carrier carousel according to claim 10, wherein the signal sources and their corresponding signal sensors are coplaner and the signal paths are substantially parallel to the planes of specimens arranged in a stacked relationship in a specimen carrier supported on a carrier platform.

12. A specimen carrier carousel according to claim 9, wherein the scanning assembly is actuatable only when a specimen carrier supported on a carrier platform is positioned in a predetermined orientation.

13. A specimen carrier carousel according to claim 1, wherein the means for adjusting the carrier platforms comprises a linear actuator mechanism, including a displaceable assembly operably connected to each of the carrier platforms through a common tilt adjustment means.

14. A specimen carousel according to claim 13, wherein the linear actuator mechanism includes a linear encoder assembly for continuously monitoring the position of the displaceable assembly.

15. A specimen carrier carousel according to claim 14, additionally comprising a specimen scanning assembly operably connected to the displaceable assembly.

16. A specimen carrier carousel according to claim 1, additionally comprising a carrier sensor assembly associated with each carrier platform capable of generating a signal indicating when: (1) a carrier is mounted on the respective carrier platform; and (2) the carrier is positioned in a predetermined orientation.

17. A specimen carrier carousel comprising:
a plurality of carrier platforms, each carrier platform adapted to support a specimen carrier having specimens arranged therein in a stacked relationship on substantially parallel planes; and
a scanning assembly having a signal source and a corresponding signal sensor adapted to scan specimens arranged in a carrier supported on a carrier platform to detect the presence and location of the specimens.

18. A specimen carrier carousel according to claim 17, wherein the scanning assembly comprises at least two signal sources, each signal source adapted to propagate a signal along a signal path, and at least two corresponding signal sensors, each signal sensor adapted to intercept the signal propagated by the respective signal source.

19. A specimen carrier carousel according to claim 18, wherein each signal path is substantially parallel to the planes of specimens arranged in a specimen carrier supported on a carrier platform.

20. A specimen carrier carousel according to claim 17, additionally comprising means for rotating the carrier platforms about a central carousel axis.

21. A specimen carrier carousel according to claim 17, comprising three specimen carrier platforms arranged radially with respect to a central longitudinal axis of the specimen carrier carousel.

22. A specimen carrier carousel according to claim 17, additionally comprising a linear actuator mechanism operably connected to the scanning assembly and capable of displacing the scanning assembly and a specimen carrier supported on a carrier platform in relation to one another to scan specimens arranged in a carrier.

23. A specimen carrier carousel according to claim 17, additionally comprising means for continuously monitoring the position of the scanning assembly.

24. A specimen carrier carousel according to claim 17, wherein the scanning assembly comprises a scanning hoop adapted to travel outside a specimen carrier supported on a carrier platform along a path generally perpendicular to the orientation of specimens arranged in the specimen carrier.

25. A specimen carrier platform assembly comprising:
a carrier platform adapted to support a specimen carrier having specimens arranged therein in a stacked relationship, the specimen carrier having opposing sides and one of the sides defining an opening through which the specimens are inserted and removed;
a scanning assembly having two optical signal sources located adjacent one side of the specimen carrier and two corresponding signal sensors located adjacent an opposing side of the specimen carrier, the scanning assembly adapted to scan specimens arranged in the specimen carrier supported on the carrier platform; and
displacement means for moving the scanning assembly and specimen carrier in relation to one another to produce signal interruptions so as to detect the presence and angular orientation of specimens within the specimen carrier.

26. A specimen carrier platform according to claim 25, wherein the scanning assembly is adapted to travel outside a specimen carrier supported on a carrier platform along a path generally perpendicular to the planar orientation of specimens arranged in the specimen carrier.

27. A specimen carrier platform according to claim 25, wherein each of the signal sources includes an optical signal source capable of emitting a substantially collimated signal.

28. A specimen carrier platform according to claim 25, additionally comprising means for continuously monitoring the position of the scanning assembly.

29. A specimen carrier platform assembly comprising:
a carrier platform adapted to support a specimen carrier having specimens arranged therein in a stacked relationship;
a subtilt assembly capable of adjusting a specimen carrier mounted on the carrier platform to provide an in-process specimen carrier positioning mechanism;
a scanning assembly having a signal source and a corresponding signal sensor adapted to scan specimens arranged in a carrier supported on the carrier platform; and
displacement means for moving the scanning assembly and specimen carrier in relation to one another to detect the presence and location of specimens within the specimen carrier.

30. A specimen carrier platform assembly comprising:

a carrier platform for supporting a specimen carrier having specimens arranged therein in a stacked relationship on substantially parallel planes in a first orientation wherein the specimens are aligned on a first plane and a second, tilted orientation wherein the specimens are aligned on a second plane tilted from the first plane; and a carrier presence indicator adapted to detect both the presence of a specimen carrier on the carrier platform and the orientation of the specimen carrier.

31. A specimen carrier platform assembly according to claim 30, wherein the carrier presence indicator provides a signal indicating that a carrier is mounted on the carrier platform and that the carrier platform is in the first orientation.

32. A specimen carrier platform assembly comprising:

a carrier platform for supporting a specimen carrier having specimens arranged therein in a stacked relationship on substantially parallel places; and a subtilt assembly allowing the carrier platform to be tilted above and below a horizontal plane, the subtilt assembly cooperating with the carrier platform to provide an in-process specimen carrier positioning mechanism.

33. A specimen carrier platform assembly according to claim 32, wherein the subtilt assembly is adapted to adjust the carrier platform to angles of about 5° and less from the horizontal.

* * * * *

UNITED STATES PATENT AND TRADEMARK OFFICE
CERTIFICATE OF CORRECTION

PATENT NO. : 5,382,806
DATED : January 17, 1995
INVENTOR(S) : Paul E. Bacchi, Manuel J. Robalino, and Paul S. Filipski It is certified that error appears in the above-indentified patent and that said Letters Patent is hereby corrected as shown below:

On the title page: Item [57] Abstract lines 19 & 20         change "is semiconductor wafer" to
--of semiconductor wafers--.

Column 20, line 7 of claim 32, change "places" to
--planes--.

Signed and Sealed this

Eighteenth Day of July, 1995

Attest:

BRUCE LEHMAN

*Attesting Officer*            *Commissioner of Patents and Trademarks*